United States Patent [19]

Miller

[11] Patent Number: 4,831,281

[45] Date of Patent: May 16, 1989

[54] MERGED MULTI-COLLECTOR TRANSISTOR

[75] Inventor: Ira Miller, Tempe, Ariz.

[73] Assignee: Motorola, Inc., Schaumburg, Ill.

[21] Appl. No.: 596,217

[22] Filed: Apr. 2, 1984

[51] Int. Cl.[4] .................. H03K 19/23; H03K 19/091; H01L 29/72; G05F 1/56

[52] U.S. Cl. ............................ 307/299.2; 307/482.1; 307/303.1; 357/36; 357/92

[58] Field of Search .............. 307/299 B, 303; 357/92, 357/36

[56] References Cited

U.S. PATENT DOCUMENTS

| | | | |
|---|---|---|---|
| 3,694,762 | 9/1972 | Mulder | 307/299 B |
| 3,771,030 | 11/1973 | Gilbert | 307/303 X |
| 3,811,074 | 5/1974 | Suzuki et al. | 307/299 B X |
| 3,822,387 | 7/1974 | Mulder | 307/299 B |
| 3,893,017 | 7/1975 | Williams | 357/36 X |
| 3,995,304 | 11/1976 | Pease | 357/36 |
| 4,096,399 | 6/1978 | Davis et al. | 307/299 B X |
| 4,131,809 | 12/1978 | Baars | 357/36 X |
| 4,140,920 | 2/1979 | Dao et al. | 307/299 B X |
| 4,274,018 | 6/1981 | Cave et al. | 307/299 B X |
| 4,323,795 | 4/1982 | Holloway et al. | 307/299 B X |
| 4,328,509 | 5/1982 | Lehning | 307/299 B X |
| 4,371,792 | 2/1983 | Dobkin | 307/299 B X |
| 4,430,580 | 2/1984 | Lovelace | 307/299 B X |
| 4,513,306 | 4/1985 | Davies | 357/36 |

OTHER PUBLICATIONS

Wiedmann, "Multiple Current Source Circuit", IBM Tech. Discl. Bull., vol. 13, No. 9, p. 2542, Feb. 1971.

Primary Examiner—Stanley D. Miller
Assistant Examiner—David R. Bertelson
Attorney, Agent, or Firm—Michael D. Bingham

[57] ABSTRACT

A laterally formed PNP transistor includes twenty-four approximately equal area emitters aligned in two rows in spaced relationship, each emitter being adjacent to another emitter and having for collectors formed thereabout to produce ninety-six collector outputs. Certain collectors between adjacent emitters and between rows are merged together with predetermined ones of the collectors associated with different emitter regions being interconnected.

8 Claims, 2 Drawing Sheets 4,831,281

MERGED MULTI-COLLECTOR TRANSISTOR

BACKGROUND OF THE INVENTION

The present invention relates to multi-collector transistor structures and, more particularly, to a merged multi-collector transistor structure for providing a plurality of predetermined weighted output currents.

There are a myriad of applications for current source schemes for providing multiple related output current sourcing. For example, digital-to-analog converters (DACs) require the generation of a plurality of binary weighted output currents to convert a digital input signal to an analog output signal as is well understood. Most DACs today require a R-2R ladder network to produce the binary weighted output currents.

A problem with using R-2R ladder networks is that the physical size thereof takes up a significant portion of the DAC chip area if the DAC is fabricated in integrated circuit form. R-2R ladders also require voltages and switches that do not lend themselves easily to single five volt systmes. In today's environment it is desired to provide more and more complex circuitry on single integrated circuit chips while reducing the cost thereof as well as increasing yields. The need for a R-2R ladder network for multiple bit DAC's can limit the complexity of the integrated circuit that can be realized due to this physical limitation.

Moreover, the resistors of the R-2R ladder network must be matched to close tolerances to ensure good accuracy of the DAC. These tolerances must be maintained during fabrication of the integrated circuit. Further, the resistors must track with temperature variations.

In view of the drawbacks related with using R-2R ladders, it is desirable to provide a means for producing multi-weighted output currents which require minimum spacing while providing minimum current ratio errors. Thus, there is a need for a current source for producing multiple related output currents therefrom.

SUMMARY OF THE INVENTION

Accordingly, it is an object of the present invention to provide an improved current source.

It is another object of the present invention to provide an improved current source that supplies multiple related output currents.

Still another object of the present invention is to provide a merged multi-collector transistor.

Yet another object of the present invention is to provide an improved lateral PNP transistor having multiple collectors.

In accordance with the above and other objects there is provided an integrated circuit, PNP transistor comprising multiple emitters formed in a base epitaxial region and multiple collectors also formed in the base epitaxial region. Each one of the multiple emitters having a plurality of the multiple collectors formed in spaced relationship therabout with predetermined ones of the multiple collectors being interconnected.

DETAILED DESCRIPTION OF THE PREFERRED EMBODIMENT

Figure 1:
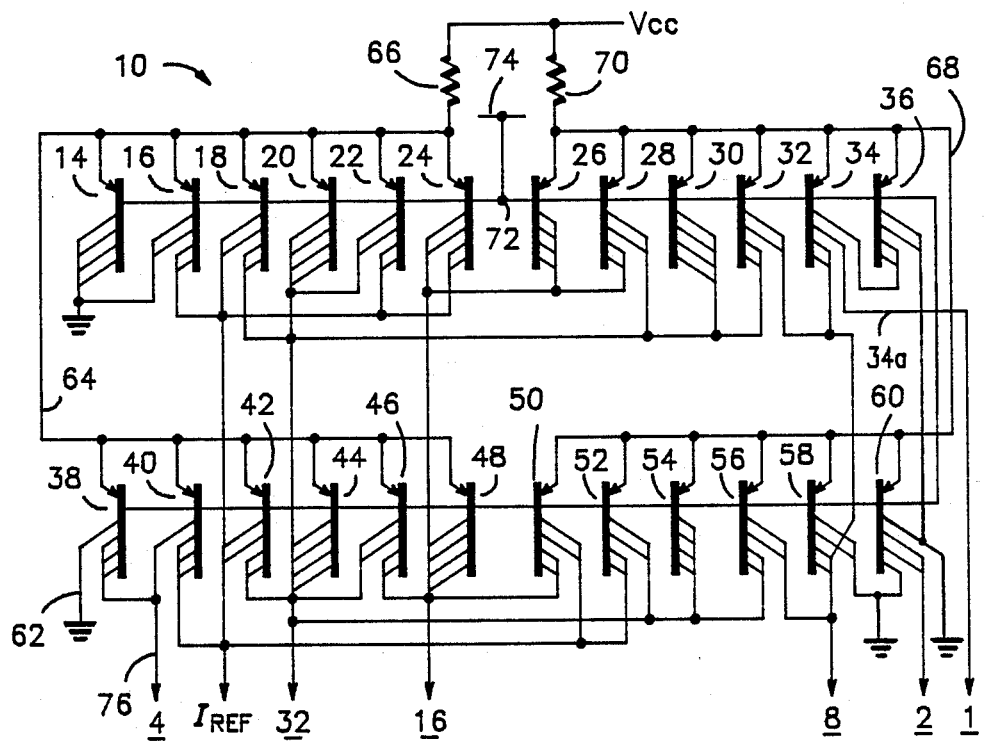
FIG. 1 is a schematic diagram illustrating the multiple collector PNP transistor of the present invention.
Figure 2:
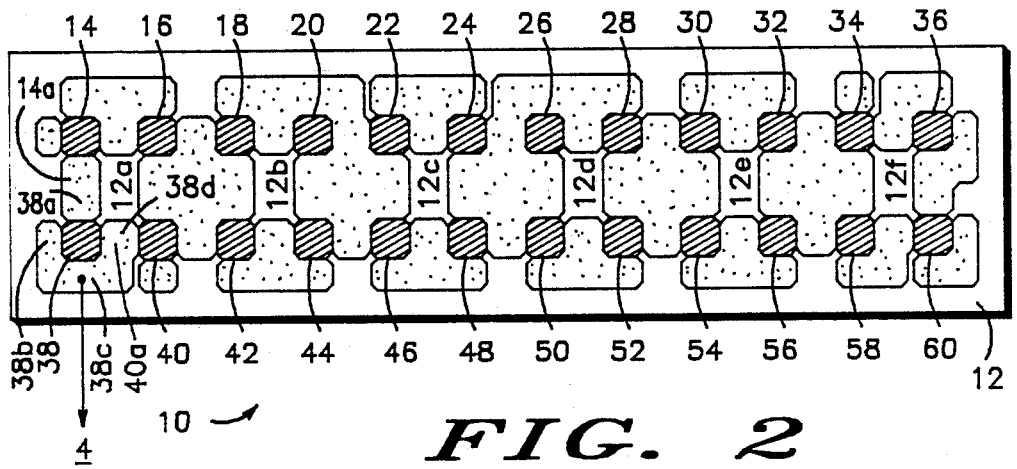
FIG. 2 is a topographical view of the transistor of FIG. 1.

Turning to FIGS. 1 and 2, there is illustrated lateral PNP transistor 10 of the present invention. Transistor 10 is a laterally formed in an integrated circuit using standard bipolar process techniques. As understood, the integrated circuit in which transistor 10 is realized comprises a substrate of a first conductivity type semiconductor material and an epitaxial layer formed on the substrate of a second conductivity type semiconductor material. A portion of the epitaxial layer may be isolated, as known, using isolating regions to form base-epitaxial region 12 in which the multi-emitters and multi-collectors of transistor 10 are fabricated. As illustrated, transistor 10 comprises 24 emitter regions formed in base region 12, by deposition for instance. Generally, each individual emitter region is identical to the next emitter region. The emitter regions are formed in an upper and a lower row. The upper row of emitter regions includes individual emitters 14, 16, 18, 20, 22, 24, 26, 28, 30, 32, 34 and 36. The lower row of emitters include individual emitters 38, 40, 42, 44, 46, 48, 50, 52, 54, 56, 58 and 60. Each individual emitter region of transistor 10 is surrounded by four collector regions with collector regions between two neighboring emitter regions being merged into the same structure (see the dot-shaded regions of FIG. 2). Thus, as illustrated, transistor 10 consists of ninety-six collector regions. As an example, emitter region 38 has the four collector regions 38a, 38b, 38c, and 38d quadraturally spaced therabout. Collector 38a is illustrated as being merged with the collector regon 14a associated with emitter region 14 and could be connected by an appropriate metal conductor or lead 62 to ground reference for example. Similarly the three collectors 38b, 38c and 38d are merged together and with the collector 40a associated with emitter 40. In a like manner particular ones of the collectors associated with each emitter of transistor 12 are merged together. Emitters 14, 16, 18, 20, 22, 24, 38, 40, 42, 44, 46 and 48 are interconnected by metal lead 64 to power supply $V_{CC}$ via resistor 66, while emitters 26, 28, 30, 32, 34, 36, 50, 52, 54, 56, 58 and 60 are interconnected by metal lead 68 to $V_{CC}$, via resistor 70. The individual base regions 12a, 12b, 12c, 12d, 12e and 12f of base region 12 are interconnected by metal lead 72 to node 74. A bias current would be sourced from node 74 as understood to render transistor 10 conductive.

If, for example, transistor 10 is utilized to provide the binary weighted currents for six-bit digital-to-analog converter 80 (FIG. 3), predetermined ones of the collectors are interconnected to obtain these currents. It is understood that any number of output weighted currents greater than six, for example, can be realized. Thus, the single collector 34a associated with emitter 34 may be utilized to provide unity current representative of the least significant bit (LSB) of the digital input signal supplied to DAC 80. Similarly, two collectors associated with emitter 60 are interconnected to provie two units of current. As previously mentioned, collectors 38b, 38c, 38d and 40a are merged and would be interconnected by lead 76 to the four collector weighted output of DAC 80.

The technique of interconnecting the higher significant bits of currents to upper and lower emitter-collectors of transistor 10 is to reduce errors and improved accuracy. For example, consider the weight of the thirty-two collector most significant bit (MSB) output 32 of transistor 10. This output uses collector outputs associated with individual emitters 18, 20, 22, 28, 30, 32, 42, 44, 46, 52, 54 and 56. Thus, when these individual collectors, along with these errors, are added together, some will have positive errors and some will have negative errors associated therewith. These errors will tend to cancel each other.

Figure 3:
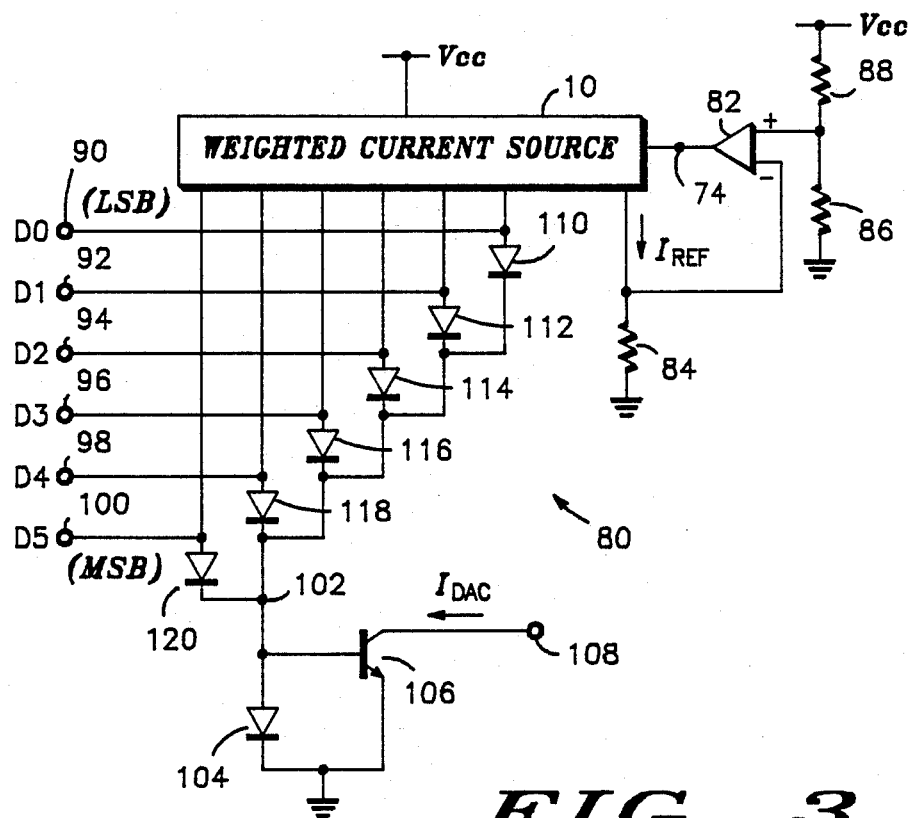
FIG. 3 is a partial block and schematic diagram of a DAC utilizing the transistor of FIG. 1.

Turning to FIG. 3, transistor 10 is illustrated as providing the binary weighted current source for DAC 80. The operation of DAC 80 is generally known and is therefore only briefly described hereinafter. The reference current $I_{REF}$ of DAC 80 is established by driving the base of merged collector PNP transistor 10 by differential amplifier 82 until the value of $I_{REF}$ generates a voltage across resistor 84 equal to the voltage supplied to the noninverting input of amplifier 82 developed across resistor 86 of the resistor divider comprising the latter resistor connected in series with resistor 88 between $V_{CC}$ and ground.

In response to a digital signal supplied to inputs 90–100, an analog output current is summed at node 102 and mirrored through diode 104 and NPN transistor 106 to sink a current $I_{DAC}$ at output 108. Depending on the logic state of each digital bit $D_0$, $D_1$, $D_2$, $D_3$, $D_4$ and $D_5$ of the digital input signal, corresponding diodes 110–120 are renedered conductive or non-conductive to produce $I_{DAC}$. For example, if $D_5$, input 100, corresponds to a logic one, a high impedance level is established at input 100 to allow diode 120 to source the MSB weighted current to summing node 102. Conversely, if $D_5$ corresponds to a logic zero, a low impedance is established at input 100 which would shunt the MSB weighted current from diode 120. At full scale, with all of the diodes 110–120 turned on, $I_{DAC}$ is equal to a weighted current of 63 units.

Hence, what has been described above is a novel merged, multi-collector lateral PNP transistor for providing a plurality of weighted output currents therefrom.

I claim:

1. A merged lateral PNP transistor, comprising:
   a plurality of collectors;
   a common base;
   a plurality of emitters, each emitter having a predetermined number of collectors in spaced relationship thereto and each one of said plurality of emitters being in spaced relationship to an adjacent one of said plurality of emitters wherein certain ones of said predetermined number of said collectors are merged with certain other ones of said predetermined number of collectors associated with each adjacent emitter; and
   conductive means for interconnecting particular ones of said plurality of colletors associated with different ones of said plurality of emitters including predetermined ones of said plurality of emitters that are not adjacent to one another to provide a plurality of collector outputs from the transistor whereby any errors associated with the collector outputs are averaged thereby reducing such errors.

2. The lateral PNP transistor of claim 1 wherein said plurality of emitters each have substantially equal areas, said plurality of emitters being aligned in two rows adjacent to one another.

3. The lateral PNP transistor of claim 2 wherein each emitter is rectangular in shape and includes four collectors of said plurality of collectors spaced equidistant about the four sides of the rectangle forming said emitter.

4. The lateral PNP transistor of claim 3 wherein said plurality of emitters includes twenty-four emitters formed in two rows of twelve emitters each substantially equidistant apart with each emitter in one of said two rows being spaced directly across from a corresponding emitter forming the second row.

5. A merged multi-collector PNP transistor having a substrate, comprising:
   a base epitaxial region formed on the substrate;
   a plurality of emitter regions disposed in said base epitaxial region in at least first and second rows, each one of said plurality of emitter regions being adjacent to at least one other one of said plurality of emitter regions in said first and second rows;
   a plurality of collector regions disposed in said base epitaxial region, a predetermined number of said plurality of collectors being associated about a particular one of each of said plurality of emitter regions with adjacent emitter regions in said at least first and second rows having said collector regions formed therebetween merged into one structure; and
   conductive means for interconnecting particular ones of said plurality of collector regions associated with different ones of said plurality of emitter regions of said at least first and second rows including predetermined ones of said plurality of emitter regions that are not adjacent to one another to provide a plurality of collector outputs from the transistor whereby any errors associated with the collector regions are averaged thereby reducing such errors.

6. An integrated current source circuit, comprising:
   a merged multi-collector PNP transistor formed laterally within the integrated circuit, said PNP transistor including a common base region, a plurality of emitter regions formed in said common base region in first and second rows with each emitter region being spaced substantially equidistance from an adjacent emitter region, each emitter region in one row being adjacent to a corresponding region in the other row, and plurality of collector regions formed in said common base region in spaced relationship to each other with each one of said plurality of emitter regions having a predetermined number of collector regions spaced thereabout with the collector regions associated between adjacent emitter regions of said first and second rows being merged together;
   means for coupling said plurality of emitter regions to an operating potential;
   conductive means for interconnecting predetermined ones of said collector regions associated with different ones of said emitter regions in said first and second rows; and
   circuit means coupled to said common base region for sourcing base current drive therefrom to render said merged multi-collector transistor conductive to produce a plurality of weighted currents at a plurality of outputs.

7. The current source of claim 6 wherein each emitter region is rectangular in shape and has equal areas, each side of said rectangular emitter region having a collector region spaced therefrom.

8. The current source of claim 7 wherein said transistor includes twenty-four emitter regions and ninety-six collector regions.

* * * * *

UNITED STATES PATENT AND TRADEMARK OFFICE
CERTIFICATE OF CORRECTION

PATENT NO. : 4,831,281

DATED : May 16, 1989

INVENTOR(S) : Ira Miller

It is certified that error appears in the above-identified patent and that said Letters Patent is hereby corrected as shown below:

Column 3, claim 1, line 55, delete "colletors" and insert therefor --collectors--.

Signed and Sealed this

Thirteenth Day of March, 1990

Attest:

JEFFREY M. SAMUELS

*Attesting Officer*     *Acting Commissioner of Patents and Trademarks*